United States Patent
Rennie et al.

(10) Patent No.: US 7,208,326 B2
(45) Date of Patent: Apr. 24, 2007

(54) EDGE PROTECTION PROCESS FOR SEMICONDUCTOR DEVICE FABRICATION

(76) Inventors: Michael Rennie, 6887 Turnage La., Mechanicsville, VA (US) 23111; Jon Davis, 315 Season Villas, 1983 Hua Mu Road, Pudong, Shanghai 201204 (CN); Robert Fuller, 10411 Morning Dew La., Mechanicsville, VA (US) 23116; Franz Hagl, An der Ilm 3a, 85290 Ilmendorf (DE)

( * ) Notice: Subject to any disclaimer, the term of this patent is extended or adjusted under 35 U.S.C. 154(b) by 102 days.

(21) Appl. No.: 10/967,869

(22) Filed: Oct. 18, 2004

(65) Prior Publication Data

US 2006/0084274 A1 Apr. 20, 2006

(51) Int. Cl.
*H01L 21/00* (2006.01)
(52) U.S. Cl. .......................... 438/9; 438/700; 438/709
(58) Field of Classification Search ............... 438/700, 438/9, 709
See application file for complete search history.

(56) References Cited

U.S. PATENT DOCUMENTS 5,387,316 A * 2/1995 Pennell et al. ............... 438/53
6,797,625 B2 * 9/2004 Kim et al. ................... 438/692
6,927,172 B2 * 8/2005 Bergner et al. ............. 438/689
2004/0259320 A1 * 12/2004 Holscher et al. ............ 438/401
2005/0269700 A1 * 12/2005 Farnworth et al. .......... 257/737

OTHER PUBLICATIONS

Singer, Neal, "Labs Patents Cool Tool To Produce Better Microchips," *Sandia LabNews*, Mar. 27, 1998, http://www.sandia.gov/LabNews/LN03--27-98/chuck_story.html, [printed Sep. 24, 2004].

* cited by examiner

*Primary Examiner*—Thao P. Le
(74) *Attorney, Agent, or Firm*—Brinks Hofer Gilson & Lione (57) ABSTRACT

An edge protection process for semiconductor device fabrication includes forming a protective layer on the circumferential edge region of a semiconductor substrate. The semiconductor substrate is placed in a plasma atmosphere and trench structures, such as deep trenches and shallow trench isolation structures are etched in the substrate. The protective layer substantially prevents the etching of the circumferential edge region, such that the formation of black silicon is substantially minimized during the etching process.

20 Claims, 5 Drawing Sheets

EDGE PROTECTION PROCESS FOR SEMICONDUCTOR DEVICE FABRICATION

TECHNICAL FIELD

The present invention relates, generally, to methods for fabricating a semiconductor device and, more particularly, to methods for plasma etching semi-conductor substrates using lithographic patterning technology.

BACKGROUND

In the fabrication of high-density semiconductor devices, a large number of devices, or chips, are fabricated on each silicon wafer. To maximum the number of chips on each wafer, the patterning and etching process is typically carried out over almost the entire surface of the silicon wafer. In order to maximize the number of chips that are fabricated on each silicon wafer, process equipment manufacturers have developed wafer handling equipment that minimizes the coverage of the silicon wafer during processing. Before the development of advanced wafer positioning technology, the resist used to form the lithographic patterns was removed so as to leave bare silicon at the periphery of the wafer. Thus, particulate contamination arising from contact by edge clamping devices with the periphery of the wafer could be minimized. Although the development of advanced wafer positioning equipment has led to the ability to fabricate an increased number of chips on each silicon wafer, exposure of the edge regions of the wafer can lead to the formation of particulate contamination during fabrication.

Plasma etching, for example, is a widely used technique for fabricating semi-conductor devices, such as integrated circuits, memory devices, logic devices, and the like. In a typical parallel plate plasma etching process, a silicon wafer is positioned within a vacuum chamber, between two radio-frequency (RF) powered electrodes. A reactive gas is introduced into the vacuum chamber and a plasma is ignited in the electrical field created between the electrodes. Typically, the plasma etching process is carried out to transfer a pattern from a lithographic mask into the underlying silicon substrate, or into deposit thin-film layers overlying the silicon substrate.

Figure 1:
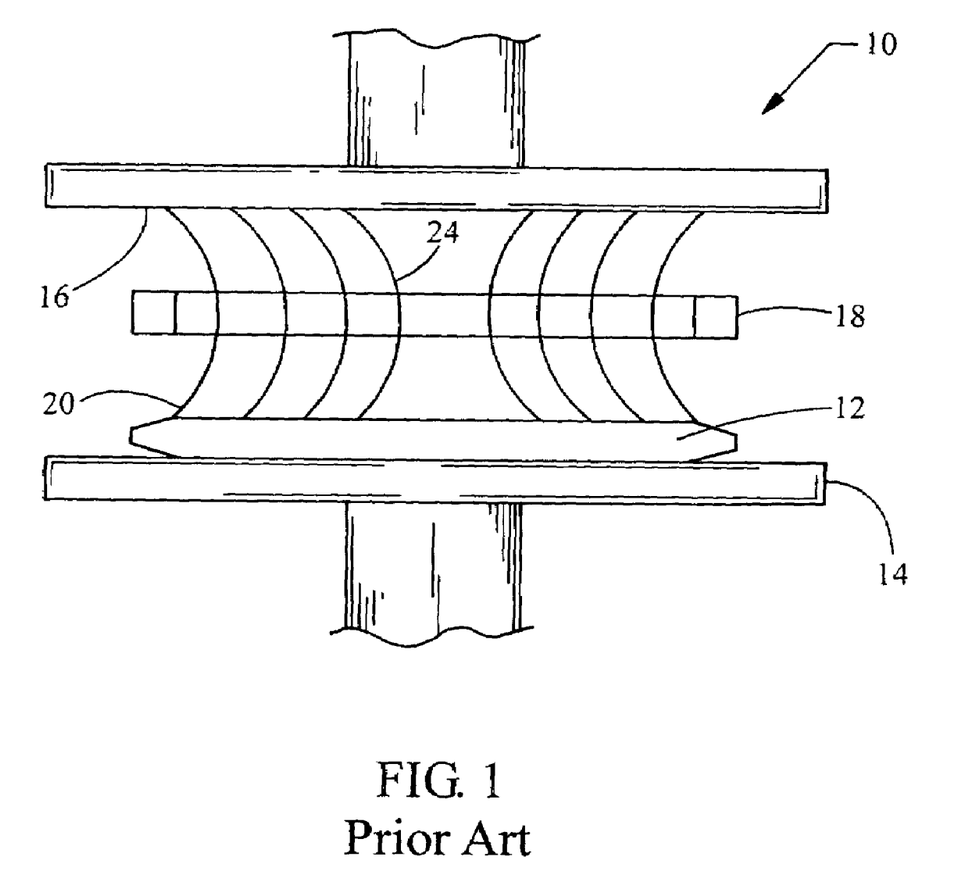
FIG. 1 is a schematic cross-sectional view of a plasma etching apparatus arranged in accordance with the prior art.

Shown in FIG. 1 is a schematic, cross-sectional view of a portion of a plasma etching chamber in a parallel plate plasma etching apparatus 10. A silicon wafer 12 is positioned on an electrostatic chuck 14 within the plasma etching chamber. An upper electrode 16 is positioned in parallel spaced relationship with electrostatic chuck 14. A shadow ring 18 is positioned between upper electrode 16 and electrostatic chuck 14.

With the development of wafer positioning devices, such as electrostatic chuck 14, the entire upper surface of silicon substrate 12 including a circumferential edge region 20 can be exposed to the plasma within plasma etching apparatus 10. By using an electrostatic chuck, silicon substrate 12 is securely positioned on the lower electrode within the plasma etching apparatus. Accordingly, a wafer clamp or other device that would partially cover circumferential edge region 20 of silicon substrate 12 is not necessary to position and hold the substrate on the lower electrode.

Figure 2:
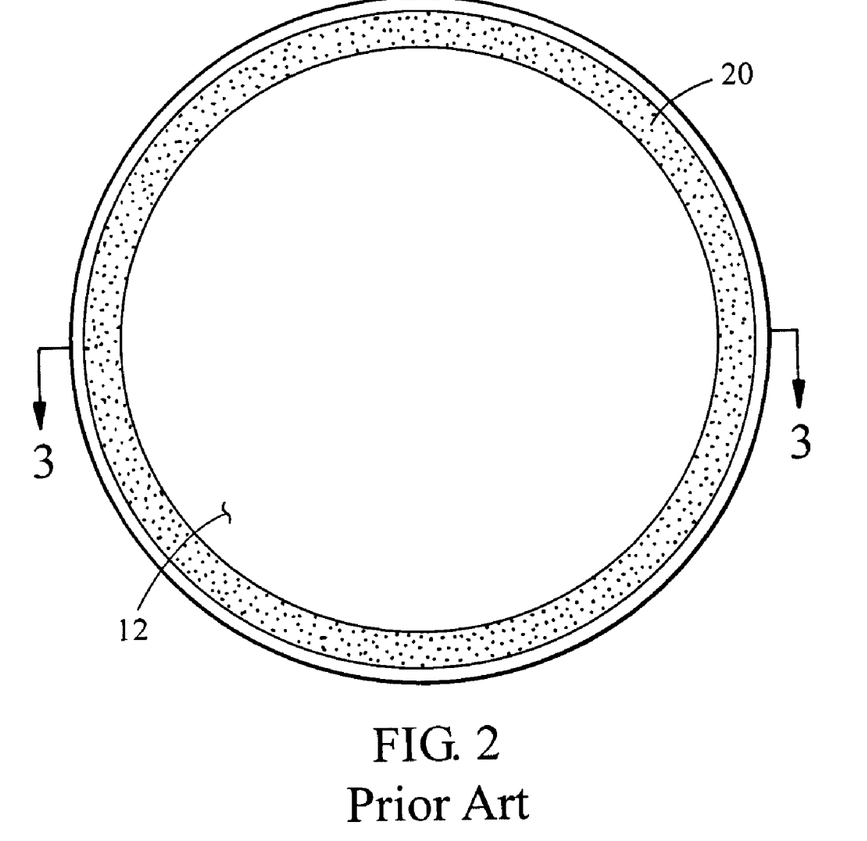
FIG. 2 is a plane view of an etched silicon substrate in accordance with the prior art.

A plane view of silicon substrate 12 is shown in FIG. 2. During the plasma etching process, circumferential edge region 20 is exposed to the plasma and, depending upon the particular process ongoing within plasma etching apparatus 10, either the substrate itself or a previously deposited thin-film layer is etched by the reactive gases in the plasma.

In a typical trench fabrication process used form, for example, trench capacitors or isolation structures, such as shallow trench isolation (STI) structures, a silicon etchant is used in the plasma etching process. In the absence of a clamp ring or other clamping device, the silicon etchant freely etches circumferential edge region 20. The silicon etchant is able to etch circumferential edge region 20 because this region is typically unprotected by the etching mask used to provide patterning for STI structures.

Figure 3:
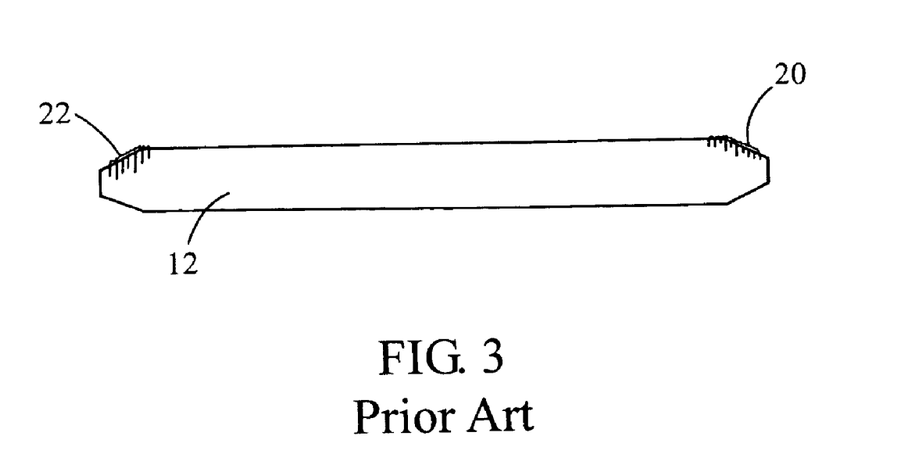
FIG. 3 is a cross-sectional view of the silicon substrate shown in FIG. 2 taken along section line 3—3.

FIG. 3 is a cross-sectional view of silicon substrate 12 taken along section line 3—3 of FIG. 2. As shown in the cross-sectional view, the attack by the silicon etchant upon circumferential edge region 20 of silicon substrate 12 forms an edged silicon region known in the art as "black silicon." The black silicon is a surface region of silicon substrate 12 in which numerous micron and submicron sized silicon filaments are formed in the substrate surface.

The formation of black silicon in a semiconductor fabrication process is problematic because the silicon filaments tend to break off during processing and can become lodged in the micron and submicron sized trenches being formed during the silicon etching process. Once a silicon fragment becomes lodged within a trench, further etching of the contaminated trench is blocked by the filament. Additionally, fragments of silicon from the filaments continue to break off during subsequent processing and can result in further contamination at later stages of device processing.

In an attempt to prevent the formation of black silicon during the plasma etching of silicon substrates, a shallow mask, such as shadow ring 18 is positioned within the plasma field as illustrated in FIG. 1. Shadow ring 18 shepards plasma field lines 24 such that the plasma field is directed away from circumferential edge region 20. While the use of a shadow ring can be beneficial in minimizing the formation of black silicon near the wafer edge, the shadow ring distorts the plasma field and can lead to non-uniform etching. Accordingly, a need existed for an improved semiconductor device fabrication process that minimizes the formation of black silicon, while avoiding plasma field distortion.

BRIEF SUMMARY

In accordance with one embodiment of the invention, a process for fabricating a semiconductor device includes providing a semiconductor substrate having a circumferential edge region. A protective layer is formed overlying the circumferential edge region and the semiconductor substrate is placed in a plasma atmosphere and the substrate is etched, where the protective layer substantially prevents etching of the circumferential edge region.

In another embodiment of the invention, a process for fabricating a semiconductor device includes providing a semiconductor substrate having a principle surface. A resist layer is applied to the principle surface. The resist layer overlying a circumferential edge region of the principle surface is selectively exposed. The resist layer is then exposed through a mask and developed to form a resist pattern. The substrate is etched to form a plurality of recessed regions in the principle surface, where a portion of the principle surface remains substantially unetched at the circumferential edge region.

In yet another embodiment of the invention, a process for fabricating a semiconductor device includes providing a semiconductor substrate and forming a hard mask overlying at least a circumferential edge region of the semiconductor substrate. The semiconductor substrate is etched to form a plurality of recessed regions in the semiconductor substrate, in which a portion of the semiconductor substrate remains substantially unetched at the circumferential edge region.

In still another embodiment of the invention, a process for fabricating a semiconductor device includes placing a semiconductor substrate in a parallel plate plasma etching apparatus. The semiconductor substrate is exposed to a substantially unobstructed plasma field, in which a protective layer overlying a circumferential edge region of the semiconductor substrate substantially prevents etching of the circumferential edge region.

It will be appreciated that for simplicity and clarity of illustration, the elements illustrated in the Figures are not necessarily drawn to scale, for example, some elements are exaggerated relative to others. Further, where deemed appropriate, reference numerals have been repeated among the Figures to illustrate corresponding elements.

DETAILED DESCRIPTION

In accordance with one embodiment of the invention, a protective layer is formed on the peripheral edge region of a semiconductor substrate prior to performing a plasma etching process. The protective layer is preferably a material that can withstand the attack by activated chemical species typically found in a plasma etching process. For example, several kinds of known resist materials are especially formulated to provide sufficient etch resistance to protect underlined features during a plasma etching process. Further, various hard mask materials, such as dielectric materials, ceramic materials, and the like, are known to provide substantial etch resistance in a silicon etching process. In one embodiment of the invention, a protective layer is formed by depositing a resist material on a semiconductor substrate and forming a resist pattern covering the peripheral edge region of a semiconductor substrate.

Figure 4:
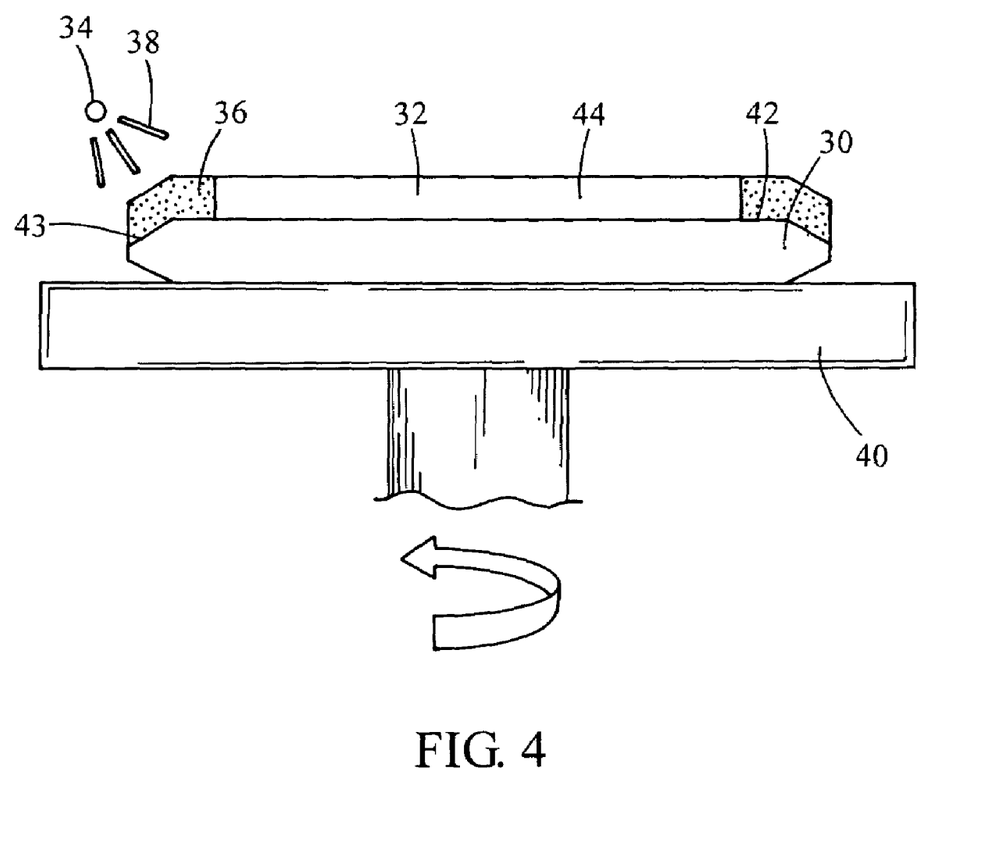
FIG. 4 is a cross-sectional view of a semiconductor substrate undergoing a process step in accordance with the invention.

FIG. 4 illustrates an exemplary process in accordance with an embodiment of the invention for fabricating a protective layer on the periphery of a semiconductor substrate. To form the protective layer, a semiconductor substrate 30 is coated with a resist layer 32. Then, semiconductor substrate 30 is subjected to a wafer edge exposure process in which a radiation source 34 bombards a portion 36 of resist layer 32 with radiation 38, while semiconductor substrate 30 is rotated on a spinning platen 40. Those skilled in the art will recognize that numerous different types of resist materials exist that are suitable for forming a protective layer over an edge portion of a semiconductor substrate.

For example, conventional photoresist, UV-resist, deep UV-resist, X-ray resist, composite resists, chemically-amplified resist, and the like, are known resist materials used in the semiconductor industry. In one embodiment of the invention, resist layer 32 is a negative-acting photoresist and radiation source 34 is an ultra-violet light source. Alternatively, a resist material responsive to various radiation frequencies can also be used, including X-ray resist materials, and the like.

In the embodiment illustrated in FIG. 4, exposed portion 34 resides over a peripheral edge region 42 of semiconductor substrate 30. The peripheral edge region also includes beveled edge 43. Those skilled in the art will recognize that the beveled edge profile of semiconductor substrate 30 is intended to minimize particulate formation caused by contact with the wafer handling equipment used during device fabrication.

The amount of exposure provided by radiation source 34 and the thickness of resist layer 32 can be varied, depending upon the surface area that is to be protected and the particular characteristics of the resist material and the radiation source. The wafer edge exposure process leaves a central portion 44 of resist layer 32 substantially unexposed by radiation emitted from radiation source 34. Accordingly, in the illustrated embodiment, a developing process subsequently carried out to develop resist layer 32 will substantially remove central portion 44, while leaving exposed portion 36 on semiconductor substrate 30. Once central portion 44 is removed, a protective layer is formed overlying circumferential edge region 42 of semiconductor substrate 30. Subsequent etching processes can now be carried out to etch semiconductor substrate 30, while circumferential edge region 42 remains protected by exposed portion 36. For example, in the etching system and process illustrated in FIG. 1, the silicon etching process can be carried out without the use of shadow ring 18.

As described above, shadow ring 18 creates a certain amount of plasma distortion of plasma field lines 24 and plasma etching apparatus 10. By selectively protecting circumferential edge region 42 of semiconductor substrate 30, the etching process illustrated in FIG. 1 can be carried out in a substantially undistorted plasma field. Further, the edge protection provided by exposed portion 36 of resist layer 44 substantially minimizes the formation of black silicon during the plasma etching process. Once the etching process is complete, exposed portion 36 can be removed and subsequent device fabrication processes can be carried out.

Figure 5:
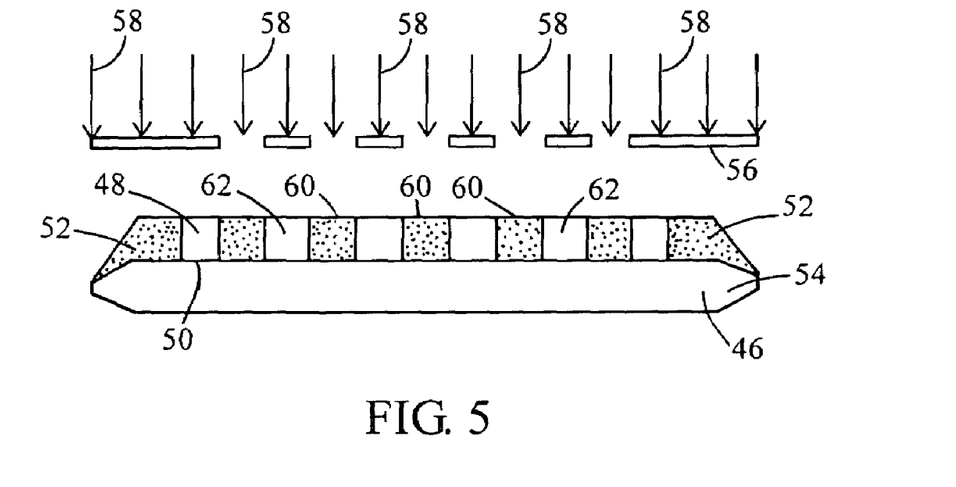
FIGS. 5–7 illustrate, in cross-section, processing steps in accordance with one embodiment of the invention.
Figure 6:
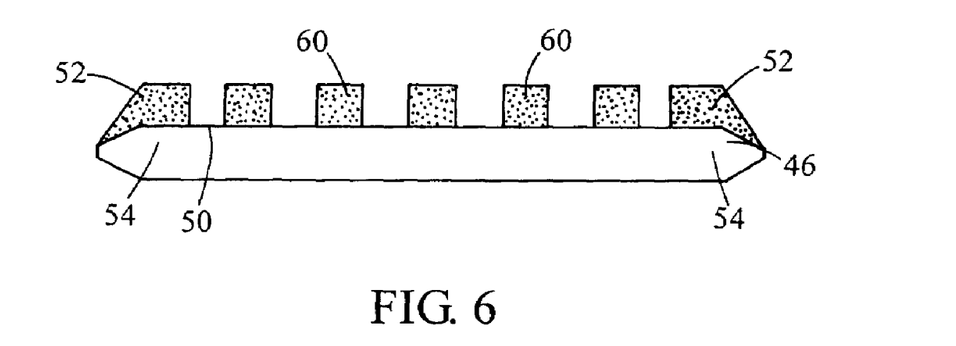
Figure 7:
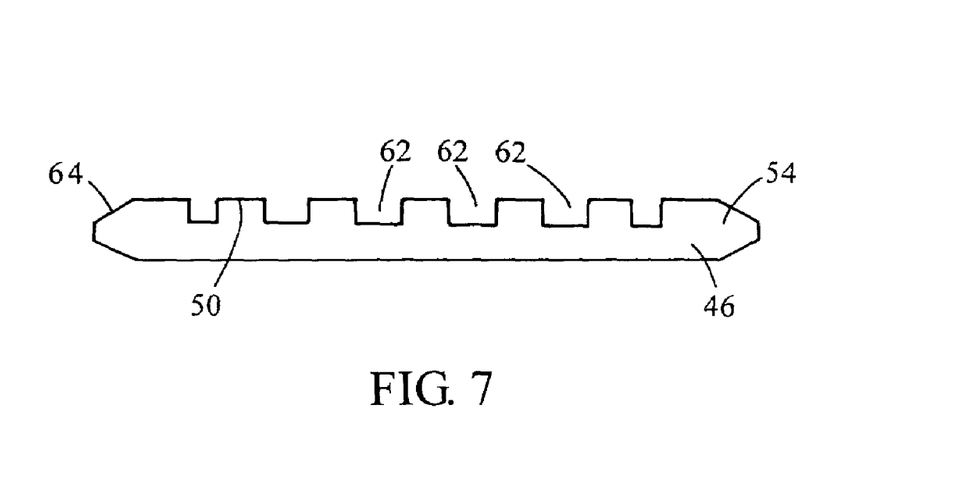

FIGS. 5–7 illustrate, in cross-section, processing steps in accordance with one processing embodiment of the invention for the fabrication of trench structures in a semiconductor substrate. The trench structures formed in the substrate can be deep trenches to be used, for example, for the fabrication of capacitors in a dynamic-random-access-memory (DRAM) device, or STI structures, or the like.

In FIG. 5, a semiconductor substrate 46 has a mask layer 48 overlying a principal surface 50 of semiconductor substrate 46. Semiconductor substrate 46 has previously undergone the process illustrated in FIG. 4 and has a protective layer 52 formed on a peripheral edge region 54 of semiconductor substrate 46. A lithographic mask 56 is aligned to semiconductor substrate 46 and mask layer 48 is exposed to radiation 58 through apertures and lithographic mask 56. The exposure to radiation 58 through the apertures and lithographic mask 56 creates exposed region 60 and resist layer 48. Lithographic mask 56 also forms unexposed region 62 and resist layer 48.

As illustrated in FIG. 6, a development process is carried out to remove unexposed portions 62 of resist layer 48 leaving exposed portion 60 overlying principal surface 50 of semiconductor substrate 46. Protective layer 52 also remains over peripheral edge region 54 of semiconductor substrate 46.

Those skilled in the art will recognize the process illustrated in FIGS. 5–6 as a masking and development process of a negative-acting photoresist material. In one embodiment of the invention, resist layer 48 is a conventional negative-acting photoresist and radiation 58 is ultra-violet light. Further, known photoresist developing processes are used to remove unexposed region 62 of resist layer 48.

Once the exposure and developing process is complete, an etching process is carried out to form trench structures 62 in principal surface 50 of semiconductor substrate 46, as illustrated in FIG. 7. During the etching process, protective layer 52 substantially blocks the etching of a peripheral edge region 54.

Accordingly, peripheral edge region 54 and beveled edge 64 of semiconductor substrate 46 remains substantially unaffected by the etching process. By protecting the edge regions of semiconductor substrate 46, the formation of black silicon is substantially minimized in semiconductor substrate 46 during the plasma etching process. Accordingly, trench structure 62 can be fabricated without contamination from silicon filaments originating from black silicon regions in semiconductor substrate 46. Further, the etching process is carried out in a plasma field relatively undistorted by the use of a shadow ring, or other shadowing device during the plasma etching process.

Figure 8:
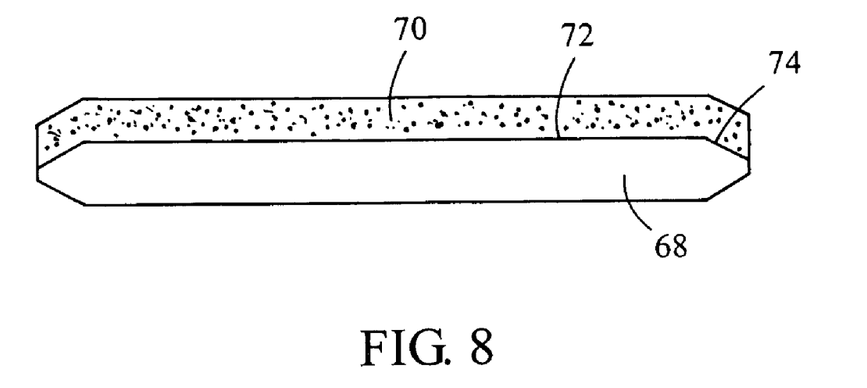
FIGS. 8–10 illustrate, in cross-section, processing steps in accordance with another embodiment of the invention.
Figure 9:
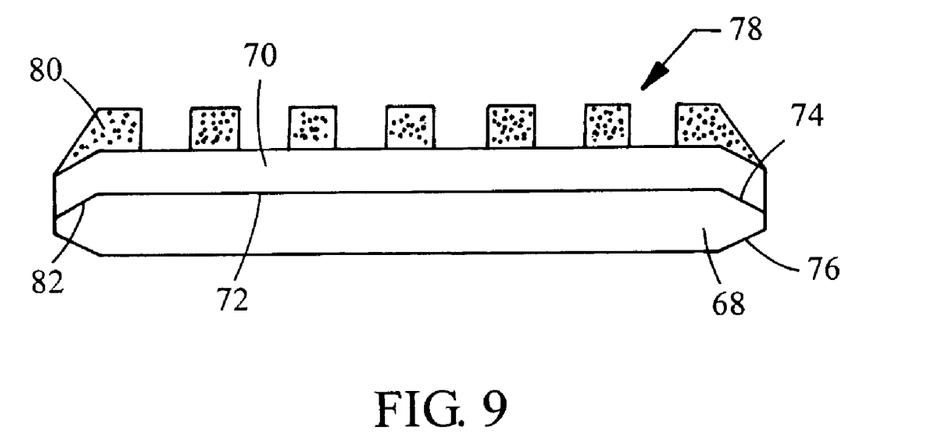

FIGS. 8–9 illustrate, in cross-section, yet another processing embodiment of the invention. Referring to FIG. 8, a semiconductor substrate 68 has a layer of hard mask material 70 overlying a principal surface 72 of semiconductor substrate 68. Hard mask layer 70 also overlies beveled edge 74 of semiconductor substrate 68. Those skilled in the art will recognize that many different kinds of hard mask materials are commonly used in semiconductor fabrication. For example, where the etching process etches a silicon material, such as single crystal silicon, polycrystalline silicon, amorphous silicon, and the like, a dielectric material can be used as a hard mask. For example, silicon oxide, silicon nitride, and combinations of silicon oxide and silicon nitride are commonly used as hard mask layers for silicon etching processes.

After forming hard mask layer 70, a resist pattern 78 is formed to overlie hard mask layer 70. Resist pattern 78 can be formed by any of the number of different resist coating, exposure, and development processes. Notably, resist pattern 78 includes a protective layer 80 overlying a circumferential edge region 82 of semiconductor substrate 68.

Figure 10:
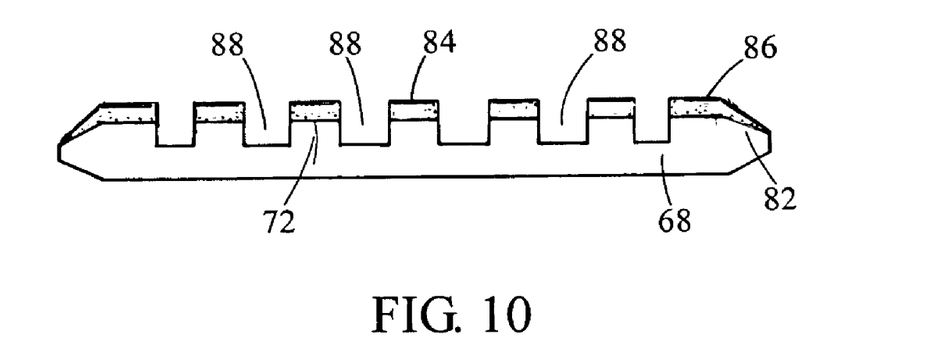

After forming resist pattern 78, an etching process is carried out to etch hard mask layer 70 and form a hard mask 84, as illustrated in FIG. 10. The etching process also forms a hard mask protective layer 86 on circumferential edge region 82 of semiconductor substrate 68. Once hard mask 84 is formed, resist pattern 78 can be removed and a subsequent etching process carried out to form trench structures 88 in principal surface 72 of semiconductor substrate 68. In similarity with the previously described embodiments of the invention, hard mask protect layer 86 substantially prevents the etching of circumferential edge region 82. Accordingly, trench structures 88 can be formed in the absence of black silicon and contaminating silicon filaments originating from the black silicon. Accordingly, the etching process can be carried out in a plasma etching apparatus by positioning semiconductor substrate 46 on an electrostatic chuck and etching in the absence of a shadow ring or other plasma distorting shadow device.

Thus, it is apparent that there has been described, in accordance with the various embodiments of the invention, an edge protection process for semiconductor device fabrication that fully provides the advantages set forth above. Those skilled in the art recognize that numerous modifications and variations can be made without parting from the spirit and scope of the invention. For example, various etching processes, such as electron-cyclotron-resonance (ECR) etching systems can be used. Accordingly, all such variations and modifications are intended to be included within the scope of the appended claims and equivalents thereof.

The invention claimed is:

1. A process for fabricating a semiconductor device comprising:
    providing a semiconductor substrate having a circumferential edge region;
    forming a protective pattern overlying the circumferential edge region, the protective pattern comprising a resist layer overlying a protective layer; and
    placing the semiconductor substrate in a plasma atmosphere and etching the substrate,
    wherein substantially the entire surface of the semiconductor substrate including the circumferential edge region is exposed to the plasma atmosphere, and
    wherein the protective pattern substantially prevents etching of the circumferential edge region.

2. The process of claim 1, wherein forming a protective layer comprises forming a dielectric layer overlying the semiconductor substrate.

3. The process of claim 2, wherein forming a protective pattern comprises:
    forming a negative acting resist overlying the dielectric layer on the circumferential edge region;
    exposing and developing the negative acting resist to form a resist mask; and
    etching the dielectric layer using the resist mask as an etching mask.

4. The process of claim 3 further comprising exposing the negative acting resist material overlying the circumferential edge region to light having a wavelength less than about 400 nanometers.

5. The process of claim 4, wherein exposing the negative acting resist material comprises directing the light toward the circumferential edge region and rotating the semiconductor substrate.

6. The process of claim 1, wherein forming a protective pattern comprises applying a layer of negative acting resist material, and wherein the process further comprises exposing the layer of negative acting resist material through a mask to form a resist pattern on the protective layer, and etching the protective layer in the plasma atmosphere using the resist pattern as an etching mask.

7. The process of claim 1, wherein providing a semiconductor substrate comprises providing a semiconductor substrate having a beveled circumferential edge.

8. A process for fabricating a semiconductor device comprising:
    providing a semiconductor substrate having a principal surface;
    applying a negative acting resist layer to the principal surface of the semiconductor substrate;
    selectively exposing the negative acting resist layer overlying a circumferential edge region of the principal surface through a mask by directing light toward the circumferential edge region while rotating the semiconductor substrate and developing the resist layer to form a resist pattern; and etching the substrate in a plasma atmosphere to form a plurality of recessed regions in the principal surface, wherein substantially the entire surface of the semiconductor substrate including the circumferential edge region is exposed to the plasma atmosphere, and wherein a portion of the principal surface remains substantially unetched at the circumferential edge region.

9. The process of claim 8, wherein etching the semiconductor substrate comprises placing the semiconductor substrate in a parallel plate plasma etching apparatus and exposing the semiconductor substrate to a substantially unobstructed plasma field.

10. The process of claim 9, wherein placing the semiconductor substrate in a parallel plate plasma etching apparatus comprises placing the semiconductor substrate on an electrostatic chuck within a vacuum chamber of the plasma etching apparatus.

11. The process of claim 8, wherein providing a semiconductor substrate comprises providing a semiconductor substrate having a beveled circumferential edge, and wherein applying a resist layer to the principal surface comprises coating at least an upper portion beveled circumferential edge.

12. The process of claim 8, further comprising removing the resist layer so as to uncover the principal surface of the circumferential edge region.

13. A process for fabricating a semiconductor device comprising:

providing a semiconductor substrate;

forming a hard mask layer overlying at least a circumferential edge region of the semiconductor substrate; and etching the semiconductor substrate in a plasma atmosphere to form a plurality of recessed regions in the semiconductor substrate, wherein substantially the entire surface of the semiconductor substrate including the circumferential edge region is exposed to the plasma atmosphere, and wherein a portion of the semiconductor substrate remains substantially unetched at the circumferential edge region.

14. The process of claim 13, wherein forming a hard mask layer comprises:

applying a resist layer to the hard mask layer;

selectively exposing the resist layer overlying a circumferential edge region of the principal surface;

exposing the resist layer through a mask and developing the resist layer to form a resist pattern; and etching the hard mask layer using the resist pattern as an etching mask.

15. The process of claim 13, wherein forming a hard mask layer comprises depositing a silicon oxide layer.

16. The process of claim 13, wherein forming a hard mask layer comprises depositing a silicon nitride layer.

17. A process for fabricating a semiconductor device comprising placing a semiconductor substrate on an electrostatic chuck within a vacuum chamber of a parallel plate plasma etching apparatus and exposing substantially the entire surface of the semiconductor substrate to a substantially unobstructed plasma field, wherein a protective pattern including a composite layer overlies a circumferential edge region of the semiconductor substrate substantially prevents etching of the circumferential edge region.

18. The process of claim 17, wherein the process further comprises forming the protective pattern by forming a hard mask overlying the circumferential edge region of the semiconductor substrate.

19. The process of claim 17, wherein the process further comprises forming the protective pattern by forming a negative acting resist material overlying a hard mask layer on the circumferential edge region of the semiconductor substrate.

20. The process of claim 19, wherein forming a negative acting resist material comprises:

applying a negative acting resist layer overlying the semiconductor substrate; and selectively exposing the resist layer overlying the circumferential edge region to light having a wavelength below about 400 nanometers.

* * * * *

UNITED STATES PATENT AND TRADEMARK OFFICE
CERTIFICATE OF CORRECTION

| | | |
|---|---|---|
| PATENT NO. | : 7,208,326 B2 | Page 1 of 1 |
| APPLICATION NO. | : 10/967869 | |
| DATED | : April 24, 2007 | |
| INVENTOR(S) | : Michael Rennie et al. | |

It is certified that error appears in the above-identified patent and that said Letters Patent is hereby corrected as shown below:

On the Title Page

In column 1, item (76), before "Jon Davis" delete "(US) 23111;" and substitute --23111 (US);-- in its place.

In column 1, item (76), after "Mechanicsville, VA" delete "(US) 23116" and substitute --23116 (US)-- in its place.

In column 2, line 2, after "6,927,172 B2*" delete "8/2005" and substitute --8/2004-- in its place.

Signed and Sealed this

Thirty-first Day of July, 2007

JON W. DUDAS
*Director of the United States Patent and Trademark Office*

UNITED STATES PATENT AND TRADEMARK OFFICE
CERTIFICATE OF CORRECTION

PATENT NO.         : 7,208,326 B2                                       Page 1 of 1
APPLICATION NO.    : 10/967869
DATED              : April 24, 2007
INVENTOR(S)        : Michael Rennie et al.

It is certified that error appears in the above-identified patent and that said Letters Patent is hereby corrected as shown below:

On the Title Page,
Insert, Item (73) Assignee:

--Infineon Technologies Richmond, LP, Sandston, VA (US)--.

Signed and Sealed this

Thirteenth Day of May, 2008

JON W. DUDAS
*Director of the United States Patent and Trademark Office*